United States Patent
Ishikawa et al.

(10) Patent No.: US 8,721,961 B2
(45) Date of Patent: May 13, 2014

(54) AU—SN ALLOY BUMP INCLUDING NO LARGE VOID AND METHOD OF PRODUCING SAME

(75) Inventors: Masayuki Ishikawa, Sanda (JP); Masayoshi Kohinata, Sanda (JP); Akifumi Mishima, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 519 days.

(21) Appl. No.: 12/094,167

(22) PCT Filed: Nov. 29, 2005

(86) PCT No.: PCT/JP2005/021838
§ 371 (c)(1),
(2), (4) Date: May 19, 2008

(87) PCT Pub. No.: WO2007/057982
PCT Pub. Date: May 24, 2007

(65) Prior Publication Data
US 2008/0304999 A1 Dec. 11, 2008

(30) Foreign Application Priority Data
Nov. 21, 2005 (JP) .................................. 2005-336084

(51) Int. Cl.
*C22C 5/02* (2006.01)
(52) U.S. Cl.
USPC ................................ 420/507; 75/247; 75/338
(58) Field of Classification Search
USPC ..................... 75/247, 338; 420/507
See application file for complete search history.

(56) References Cited

FOREIGN PATENT DOCUMENTS

| | | |
|---|---|---|
| EP | 1 777 032 A1 | 4/2007 |
| JP | 64-31907 | 2/1989 |
| JP | 2-115307 | 4/1990 |
| JP | 4 262895 | 9/1992 |
| JP | 10-163270 A | 6/1998 |
| JP | 2001-176999 | 6/2001 |
| JP | 2003-105462 | 4/2003 |
| JP | 2003105462 A * | 4/2003 |
| JP | 2003 260588 | 9/2003 |
| JP | 2005-262317 | 9/2005 |
| JP | 2005262317 A * | 9/2005 |
| JP | 2006 7288 | 1/2006 |
| KR | 10-1141089 | 5/2012 |

OTHER PUBLICATIONS

Ishikawa, Masayuki et al., "Bonding and Sealing Technology for Fine Parts and Device Using Au-20wt%Sn solder paste", Collected Papers of 10th Symposium on Microjoining and Assembly Technology in Electronics, Welding Society, vol. 10, pp. 95-100, (2004).
Office Action issued Feb. 2, 2011 in Japanese Patent Application No. 2005-336084 (with English translation).
Korean Notice of Allowance issued Dec. 18, 2012 in Patent Application No. 10-2008-7011683 with English Translation.
Notice of Preliminary Rejection issued Jun. 12, 2012 in Korean Patent Application No. 10-2008-7011683 (with English translation).

* cited by examiner

*Primary Examiner* — Weiping Zhu
(74) *Attorney, Agent, or Firm* — Oblon, Spivak, McClelland, Maier & Neustadt, L.L.P.

(57) ABSTRACT

An Au—Sn alloy bump that does not include large voids and a method of producing the same are provided. The Au—Sn alloy bump that does not include large voids comprises a composition containing Sn: 20.5 to 23.5 mass % and the balance Au and unavoidable impurities, and a structure where 0.5 to 30 area % of Sn-rich primary crystal phase is crystallized in the matrix.

7 Claims, 6 Drawing Sheets

US 8,721,961 B2

AU—SN ALLOY BUMP INCLUDING NO LARGE VOID AND METHOD OF PRODUCING SAME

TECHNICAL FIELD

The present invention relates to an Au—Sn alloy bump including no large voids, specifically including no voids larger than 30% of the bump diameter and a method of producing the same bump.

BACKGROUND ART

Au—Sn alloy solder paste is generally used in joining a substrate and semiconductor elements such as GaAs light elements, GaAs high frequency elements, and thermo-conducting elements, and in sealing of packages of fine and high-airtight requiring devices such as SAW filters and crystal oscillators. It is known that Au—Sn alloy powder included in the Au—Sn alloy solder paste is a powder of Au—Sn eutectic alloy having a composition containing 20 mass % of Sn with the balance consisting of Au and unavoidable impurities. It is also known that the Au—Sn eutectic alloy powder is generally obtained by a gas-atomizing process.

It is known that An-Sn alloy bump may be used as electrodes or the like by forming a perforated dry film layer on a substrate, filling the Au—Sn alloy paste in the perforations of the dry film layer, subjecting the Au—Sn alloy paste to reflow melting and forming Au—Sn alloy bumps on the surface of the substrate, and removing the dry film layer (see Non Patent Reference 1).

Non Patent Reference 1: Collected Papers of 10th Symposium on Microjoining and Assembly Technology in Electronics, Vol. 10, 2004, pp 95-100 (Published on Feb. 5, 2004 by Japan Welding Society)

DISCLOSURE OF INVENTION

Problems to be Solved by the Invention

However, where the Au—Sn alloy bump is produced using the paste including the Au—Sn alloy powder having a composition containing 20 mass % of Sn with the balance consisting of Au and unavoidable impurities as described in the above-described Non Patent Reference 1, the Au—Sn bump includes large residual voids generated in the interior. When the Au—Sn alloy bump including large residual voids in the interior is used for joining a semiconductor element and a substrate or the like, the large voids also remain in the jointing. The large voids in the jointing act as an origin of cracking, and therefore reliable jointing cannot be obtained by the Au—Sn alloy solder. Where the voids included in the Au—Sn bump are small voids having a size of 30% or less of the bump diameter, reliability of the jointing is not lowered since such voids do not act as origins of cracking. Therefore, there has been a demand for Au—Sn alloy bumps that do not include large voids larger than 30% of the bump diameter.

Expedients for Solving the Problems

Therefore, the inventors conducted research for achieving a bump which does not include large voids in its interior. As a result of the research, it was found that large residual voids are depleted from the interior of Au—Sn alloy bumps, where the Au—Sn alloy bumps were obtained by reflow treatment of Au—Sn alloy solder paste produced by mixing Au—Sn alloy powder with flux, where the Au—Sn alloy powder has a composition containing Sn: 20.5 to 23.5 mass %, and the balance Au and unavoidable impurities, and a structure containing a matrix and 0.5 to 30 area 5 of Sn-rich primary crystal phase crystallized in the matrix.

Based on the above-described research result, the present invention includes the following aspects.

(1) An Au—Sn alloy bump which does not include large voids, having a composition containing Sn: 20.5 to 23.5 mass % with the balance consisting of Au and unavoidable impurities, and a structure where 0.5 to 30 area % of Sn—rich primary crystal phase is crystallized in the matrix.

(2) A method of producing an Au—Sn alloy bump which does not include large voids, comprising coating in a spot-like manner a solder paste obtained by mixing Au—Sn alloy powder with flux, and subjecting the solder paste to a reflow treatment, wherein the Au—Sn alloy powder has a composition containing Sn: 20.5 to 23.5 mass %, and the balance Au and unavoidable impurities, and a structure containing 0.5 to 30 area % of Sn-rich primary crystal phase crystallized in a matrix.

Au—Sn alloy solder paste used in the method of producing an Au—Sn alloy bump that does not includes large voids according to the present invention is prepared by the following method. Firstly, molten metal obtained by melting Au—Sn alloy having a composition containing Sn: 20.5 to 23.5 mass % and the balance consisting of Au and unavoidable impurities is maintained at a temperature of 600 to 1000° C. and mechanically mixed. While mixing or after mixing the molten metal, while pressurizing the mixed molten metal at 300 to 800 kPa, the mixed molten metal is sprayed from a small-sized nozzle having a nozzle diameter of 1 to 2 mm by an inert gas at a spraying pressure of 5000 to 8000 kPa with a nozzle gap of not greater than 0.3 mm. Thus, Au—Sn alloy powder crystallizing 0.5 to 30 area % of Si-rich primary crystal phase is obtained.

It is preferable that the above-described mixing be performed by mechanical mixing. Propeller mixing is preferable as the mechanical mixing. Electric stirring such as electromagnetic stirring may be combined with the mechanical mixing. Therefore, an electromagnetic stirrer can be combined with a mechanical mixer.

The rotation speed of the above-described mechanical mixing is not limited. Preferably, the mixing is performed by a propeller mixing at 60 to 100 r.p.m for 3 to 10 minutes. In the above-described method of producing an Au—Sn alloy powder, by the mixing of the molten metal of the Au—Sn alloy, Sn-rich primary crystal phase does not grow to a large crystal, and it is possible to obtain a molten metal of Au—Sn alloy having no clusters of Au-rich primary crystal phase. By atomizing the thus obtained mixed molten metal of Au—Sn alloy, it is possible to obtain Au—Sn alloy powder which is free of Au-rich primary crystal phase and has 0.5 to 30 area % of Sn-rich primary crystal phase crystallized in the matrix. Au—Sn alloy solder paste is produced by mixing the thus obtained Au—Sn alloy powder and flux composed of commercially available rosin, active material, solvent, and thickening agent.

Where Au—Sn alloy powder is obtained by gas-atomizing a molten metal of Au—Sn alloy containing Sn: 20.5 to 23.5 mass % with the balance of Au and unavoidable impurities without mechanically mixing the molten metal, the amount of Sn-rich primary crystal phase, if any crystallization occurs, is extremely small and does not exceed 0.4%. When a Au—Sn alloy solder paste is obtained by mixing the Au—Sn alloy powder containing a small amount of Sn-rich primary crystal phase with a commercially available flux, and bumps are obtained by coating the solder paste in a spot-like manner on a substrate and subjecting the paste on the substrates to a reflow melting, large voids larger than 30% of the bump diameter are included inside the bumps.

On the other hand, the above-described Au—Sn alloy powder having a structure showing crystallization of 0.5 to 30 area % of Sn-rich primary crystal phase and absence of Au-rich primary crystal phase can be produced by mechanically mixing a molten metal of Au—Sn alloy having a composition containing Sn: 20.5 to 23.5 mass % with the balance consisting of Au and unavoidable impurities, and atomizing the mechanically mixed Au—Sn molten alloy. In the bumps obtained by an Au—Sn alloy solder paste as a mixture of this type of Au—Sn alloy powder and commercial flux on a substrate in a spot-like manner and subjecting the paste coated on the substrate to a reflow melting, the number of voids included inside the bump is reduced, and generation of large voids exceeding 30% of the bump diameter is completely avoided.

In the present invention, the content of Sn included in the Au—Sn alloy bump was limited to 20.5 to 23.5 mass % based on the following reason. If the content of Sn included in the bump is less than 20.5 mass %, it is not preferable since Au-rich primary crystal phase crystallizes, increasing the melting point and viscosity of the melt, and gas generated during the melting of the paste is trapped in the vicinity of the substrate, causing residual voids inside the bumps. On the other hand, where the content of Sn exceeds 23.5 mass %, it is not preferable since large Sn rich primary crystal phase crystallizes even when the molten metal is mechanically mixed, and Sn-rich primary crystal phase crystallizes in an amount exceeding 30 area %, causing difficulty in escapement of voids from the interior of the bump and resulting in residual voids included in the bump.

The amount of Sn-rich primary crystal phase crystallizing in the Au—Sn alloy powder included Au—Sn alloy paste used in the production of Au—Sn alloy bump of the present invention was limited to 0.5 to 30 area % based on the following reason. Where the amount of Sn-rich primary crystal phase crystallizing in the Au—Sn powder is less than 0.5% in a section of the Au—Sn powder, it is not preferable since crystallization of Au-rich primary crystal phase occurs. Since the Au-rich primary crystal phase has a high melting point compared to other eutectic structures, the viscosity of the melt is increased at the same temperature, and the gas generated during melting of the paste is trapped, causing generation of voids. Where the amount of Sn-rich primary crystal phase crystallizing in the Au—Sn powder is more than 30% in a section of the Au—Sn powder, it is not preferable since the melting point apparently shifts to a high temperature. By the increased proportion of the Sn-rich primary crystal phase and melting point shifting from the eutectic point, melting point is increased, viscosity of the melt is increased, and flowability of the melt is decreased. As a result, gas generated during melting of the paste is trapped, causing generation of voids.

A more preferable range for the amount of Sn-rich primary crystal phase crystallizing in the Au—Sn alloy powder included in the Au—Sn alloy paste used in the production of Au—Sn alloy bump of the present invention is 10 to 20 area %.

Effect of the Invention

Since the Au—Sn alloy bump of the present invention does not include large voids larger than 30% of the bump diameter, compared to the conventional Au—Sn alloy bump, there is a lower possibility of causing generation of cracks starting from voids, and the joint portion has a high reliability. Therefore, the proportion of defective products of semiconductor devices is decreased, enabling reduction of cost. Thus, the present invention provides an excellent industrial effect.

BEST MODE FOR CARRYING OUT THE INVENTION

Au—Sn alloys having compositions shown in Table 1 were made molten in a high frequency melting furnace. While maintaining the molten metal of each alloy at a temperature shown in Table 1, the molten metal was mechanically mixed by a propeller revolving at a cycle shown in Table 1 for a duration shown in Table 1. While mixing or after mixing each molten metal, a pressure shown in Table 1 was applied to the molten metal, thereby dropping the molten metal from a nozzle provided to a bottom of the high frequency melting furnace. At the same time, from gas nozzles that had a diameter shown in Table 1 and were provided around the nozzle such that the nozzle gap was 0.2 mm, Ar gas was injected to the dropping molten metal with an injection pressure shown in Table 1. Thus gas atomized powders were produced. By sieving each gas atomized powder using a sieve, Au—Sn alloy powders having an average grain size of 20 $\mu$m were produced.

Each of these Au—Sn alloy powders was embedded in a resin. After polishing a section of the resin, an EPMA photograph was taken from the section. Ten powder particles having a particle section diameter of 15 $\mu$m were randomly sampled from the EPMA image, and the area % of Sn-rich primary crystal phase in a section area of the powder was obtained using an image processing software. The results are shown in Table 1.

Commercial RMA flux was mixed with each of the Au—Sn alloy powders such that the flux ratio was 7 mass %. Thus, Au—Sn alloy solder pastes 1 to 11 were produced.

Next, the following measurements were performed using these Au—Sn alloy solder pastes 1-11.

Firstly, plates made of Si, each having a dimension of 10 mm in length, 10 mm in width, and 1 mm in thickness were produced. After forming an Al-sputtered film of 0.5$\mu$m in thickness on a surface of each plate, a Ni—V alloy sputtered film of 0.5 $\mu$m in thickness was formed on the Al-sputtered film, and a Cu-sputtered film of 1.0 μm was formed thereon. A dry film layer having a thickness of 70 μm and holes of 95 μm in diameter was formed on the plates each having the Cu-sputtered film. The above-described Au—Sn alloy solder pastes 1 to 11 were filled in the holes of the dry film layer and subjected to reflow treatment (preliminary heating at 150° C. for 60 seconds and main heating at 320° C. for 60 seconds). Thus, Au—Sn alloy bumps 1 to 11 were produced. For each of Au—Sn bumps 1 to 11, 1000 bumps each having a diameter of 80 μm and a height of 60 μm were produced.

Figure 1:
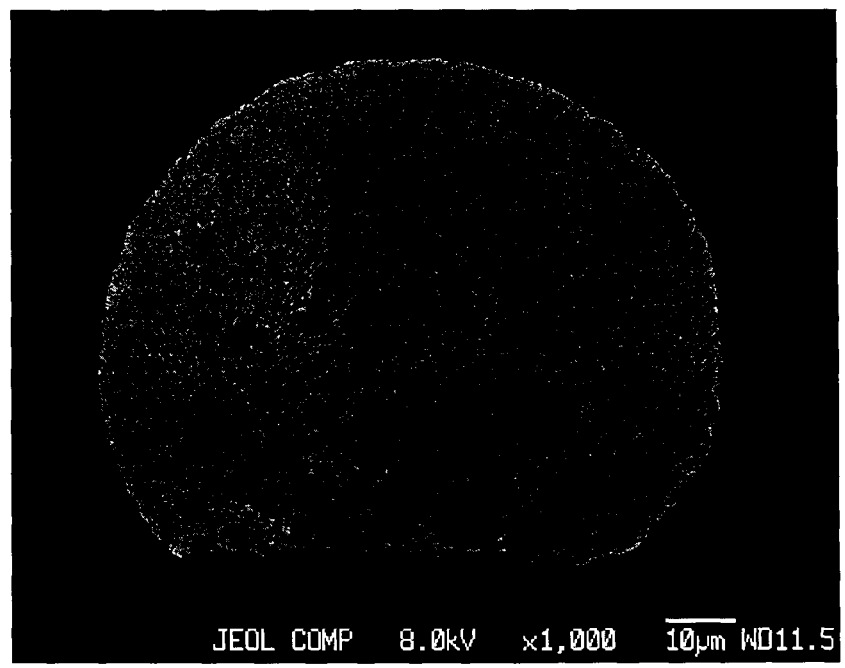
FIG. 1 is a metallographic microscopy photograph of a section of Au—Sn alloy bump 1.
Figure 2:
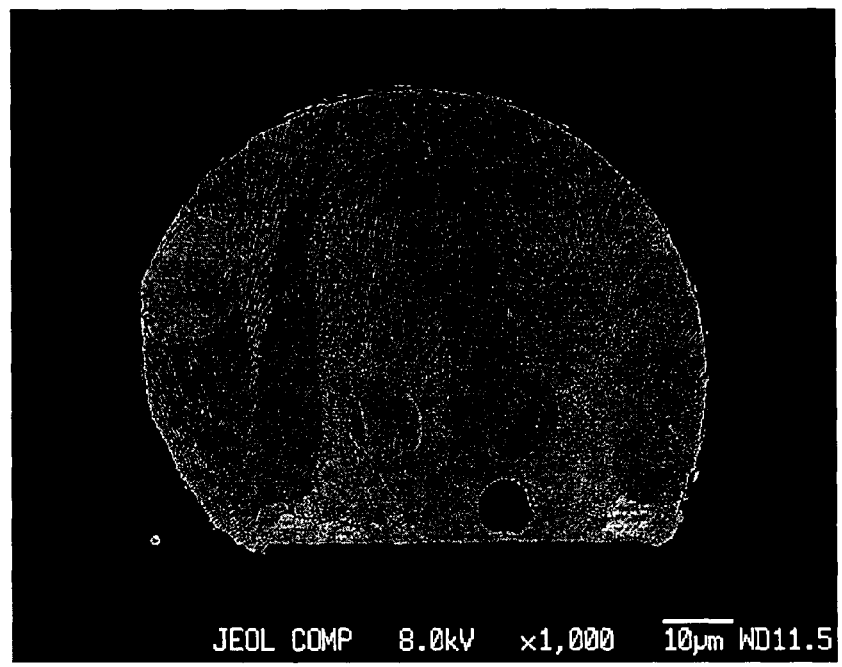
FIG. 2 is a metallographic microscopy photograph of a section of Au—Sn alloy bump 2.
Figure 3:
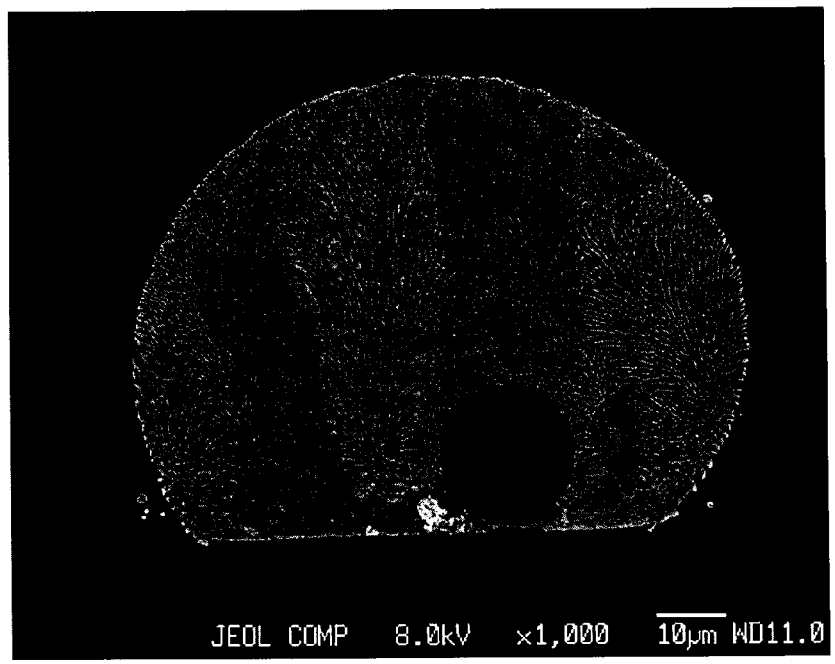
FIG. 3 is a metallographic microscopy photograph of a section of Au—Sn alloy bump 3.
Figure 4:
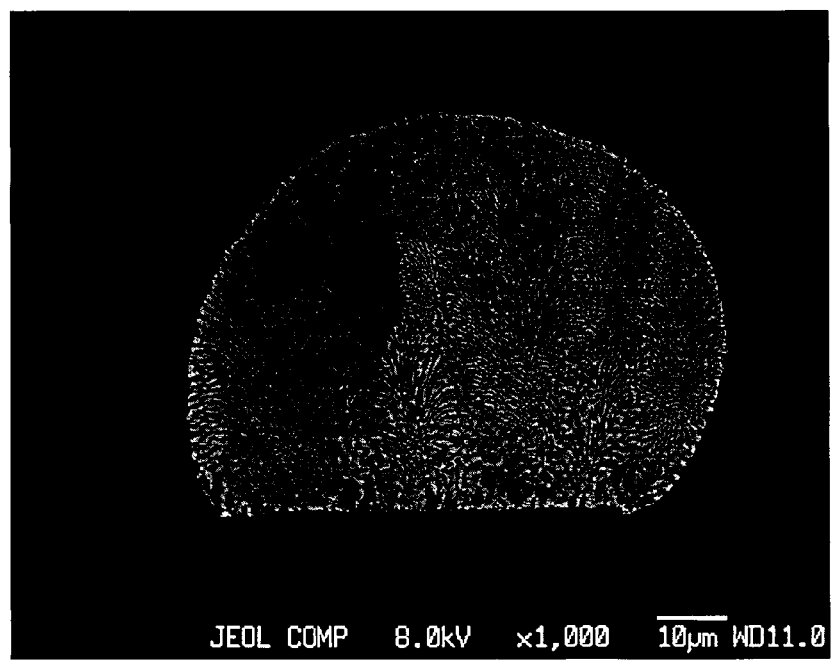
FIG. 4 is a metallographic microscopy photograph of a section of Au—Sn alloy bump 4.
Figure 5:
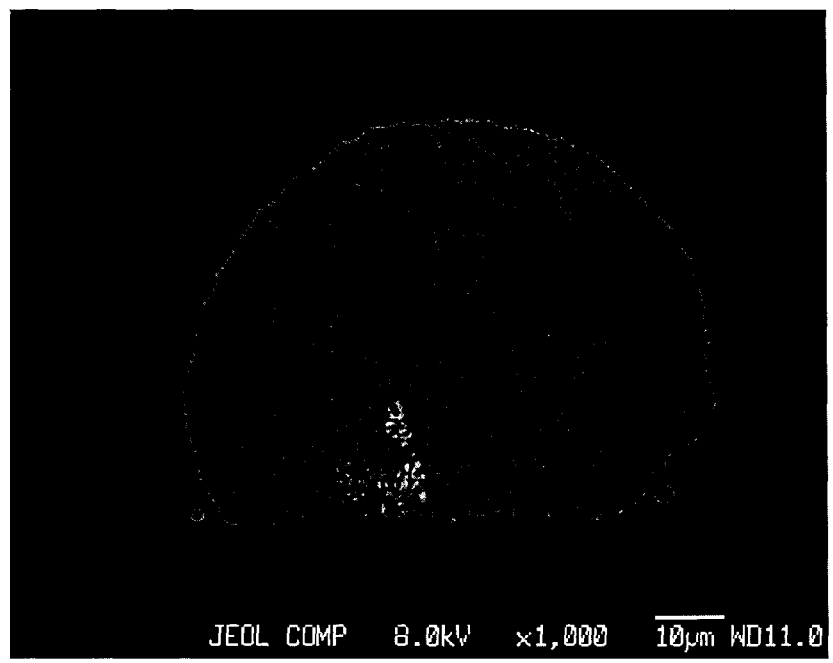
FIG. 5 is a metallographic microscopy photograph of a section of Au—Sn alloy bump 5.
Figure 6:
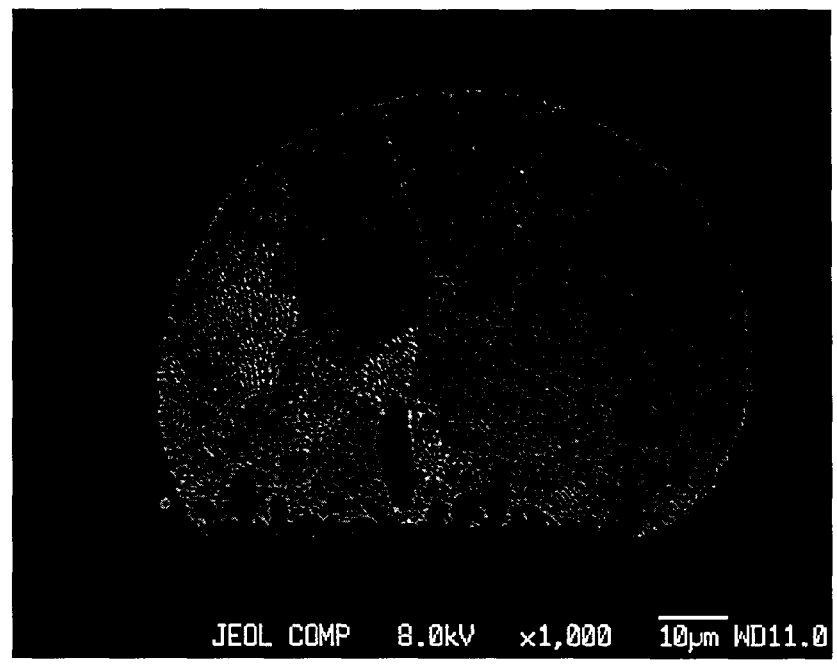
FIG. 6 is a metallographic microscopy photograph of a section of Au—Sn alloy bump 6.
Figure 7:
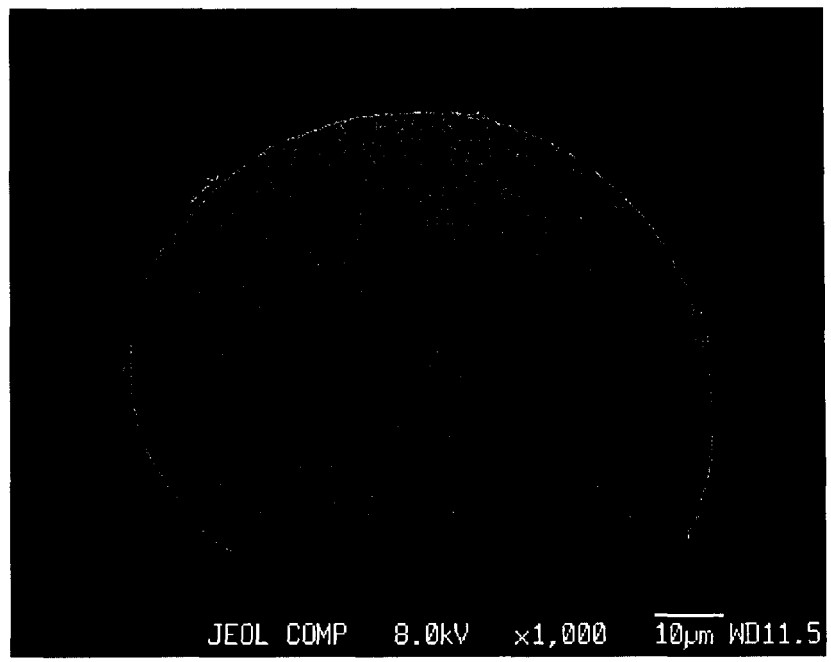
FIG. 7 is a metallographic microscopy photograph of a section of Au—Sn alloy bump 7.
Figure 8:
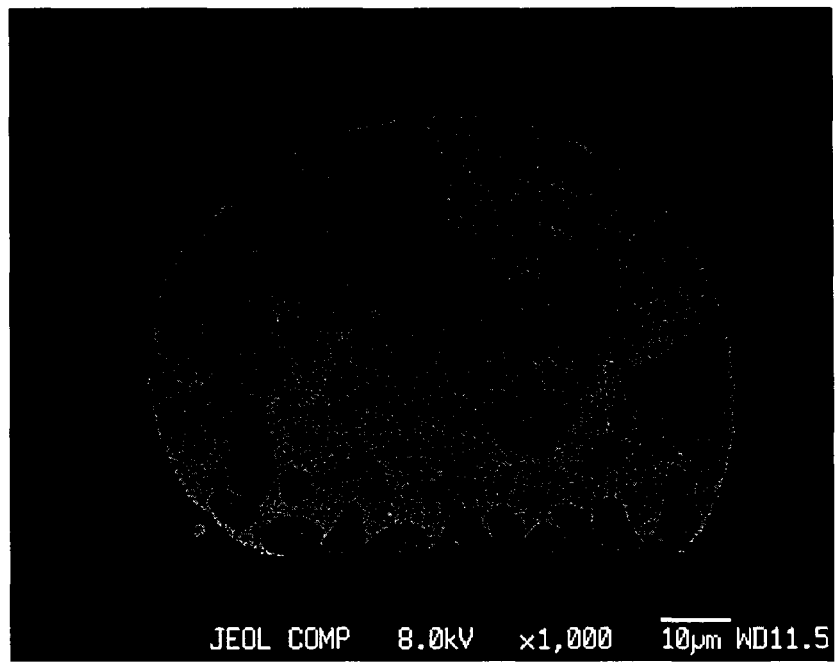
FIG. 8 is a metallographic microscopy photograph of a section of Au—Sn alloy bump 8.
Figure 9:
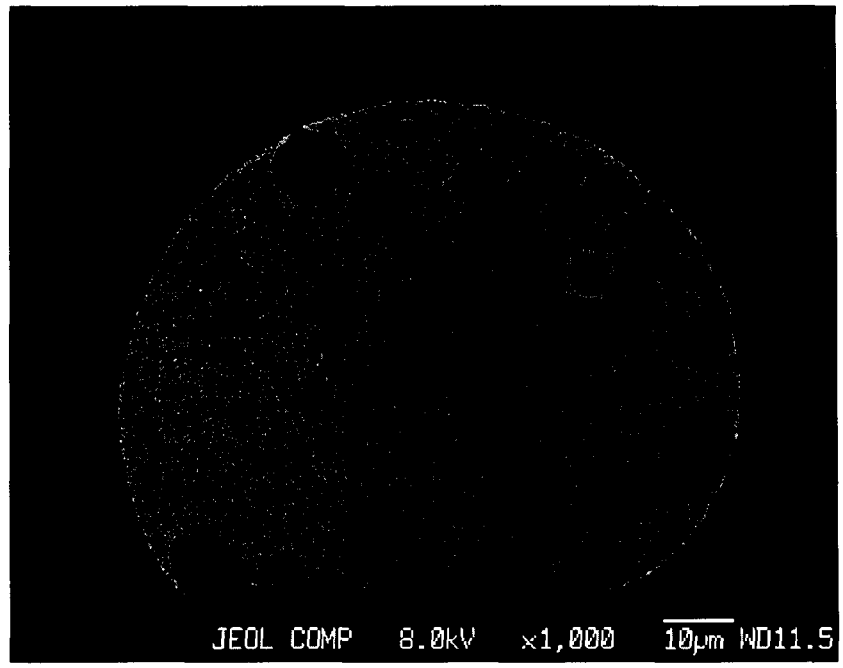
FIG. 9 is a metallographic microscopy photograph of a section of Au—Sn alloy bump 9.
Figure 10:
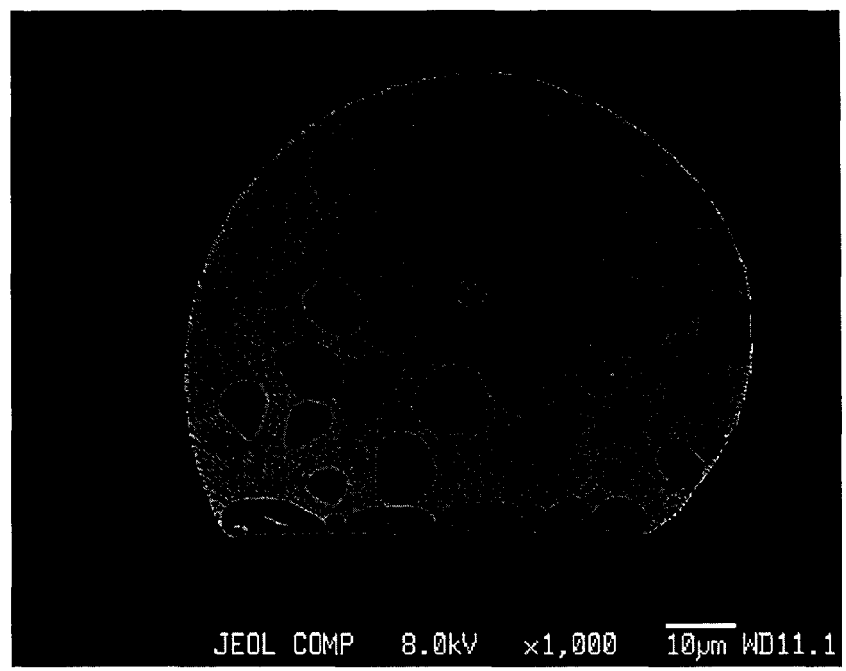
FIG. 10 is a metallographic microscopy photograph of a section of Au—Sn alloy bump 10.
Figure 11:
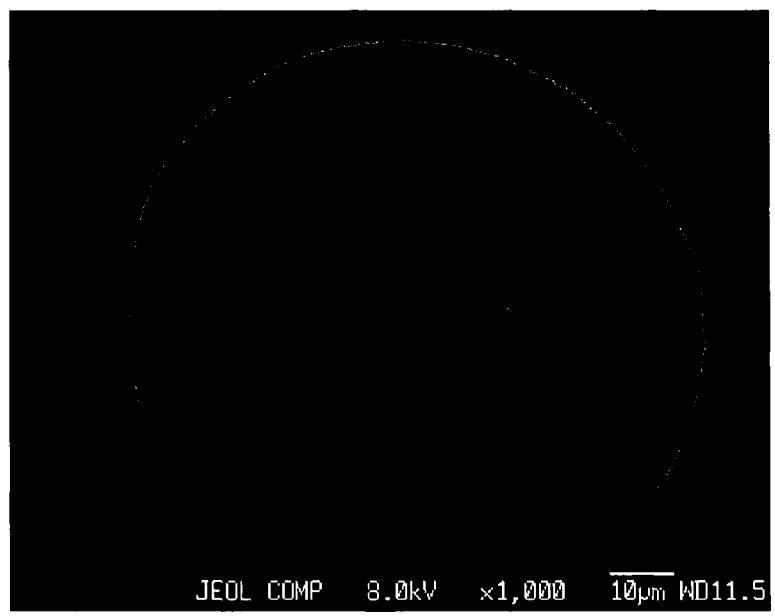
FIG. 11 is a metallographic microscopy photograph of a section of Au—Sn alloy bump 11.

Cross sections of these Au—Sn alloy bumps were observed using a metallographic microscope in 1000 fold magnification, and texture photographs were taken from the cross sections. The texture photographs are shown in FIGS. 1 to 11. After that, using the above-described texture photographs, the area % of Sn-rich primary crystal phase in the cross sectional area of each of the Au—Sn alloy bumps 1 to 11 was measured using an image processing software. The results of the measurements are shown in Table 2. Further, 240 bumps were sampled for each of the Au—Sn alloy bumps 1 to 11. For each of the 240 Au—Sn alloy bumps 1 to 11, numbers and diameters of voids included in the bump were measured using a transmission X-ray apparatus. Based on the proportion of the void diameters to the bump diameters, each of the voids were classified into four groups, namely, voids having a diameter of not greater than 10% of the bump diameter, voids having a diameter of greater than 10% and not greater than 20% of the bump diameter, voids having a diameter of greater than 20% and not greater than 30% of the bump diameter, and voids having a diameter greater than 30% of the bump diameter. The number of voids of each group is listed in Table 2.

TABLE 2

| Type | Paste of Table 1 used in production of bump | Composition of Au—Sn alloy bump (mass %) | | Amount of generation of Sn-rich primary phase in sectional area of Au—Sn alloy bump (area %) | Number of voids per size range included in Au—Sn alloy bump Ratio of void diameter per bump diameter (%) | | | | Remark |
|---|---|---|---|---|---|---|---|---|---|
| | | Sn | Au and unavoidable impurities | | Less than 10% | More than 10% to 20% | More than 20% to 30% | More than 30% | |
| Au—Sn alloy bump | 1 | 1 | 18.1 | Balance | 0.0 | 91 | 126 | 19 | 4 | Comparative |
| | 2 | 2 | 18.9 | Balance | 0.0 | 121 | 104 | 10 | 5 | Comparative |
| | 3 | 3 | 20.1 | Balance | 0.0 | 187 | 41 | 10 | 2 | Conventional |
| | 4 | 4 | 20.5 | Balance | 0.6 | 219 | 16 | 5 | 0 | Inventive |
| | 5 | 5 | 20.9 | Balance | 0.8 | 236 | 4 | 0 | 0 | Inventive |
| | 6 | 6 | 22.1 | Balance | 9.0 | 238 | 2 | 0 | 0 | Inventive |
| | 7 | 7 | 23.2 | Balance | 15.0 | 192 | 47 | 1 | 0 | Inventive |
| | 8 | 8 | 23.5 | Balance | 29.0 | 184 | 53 | 3 | 0 | Inventive |
| | 9 | 9 | 24.1 | Balance | 42.0 | 95 | 137 | 7 | 1 | Comparative |
| | 10 | 10 | 26.1 | Balance | 58.0 | 58 | 166 | 11 | 5 | Comparative |
| | 11 | 11 | 30.0 | Balance | 82.0 | 28 | 183 | 20 | 9 | Comparative |

TABLE 1

Production conditions of Au—Sn alloy powder

| Type | | Composition of molten metal (mass %) | | Melting conditions | Conditions of propeller mixing | | Atomizing conditions | | | Amount of generation of Sn-rich primary phase in sectional area of Au—Sn alloy Powder (area %) |
|---|---|---|---|---|---|---|---|---|---|---|
| | | Sn | Au and unavoidable impurities | Retention temperature of Au—Sn molten metal (° C.) | Cycle of propeller (rpm) | Duration of revolving propeller (minutes) | Pressure applied to molten metal (kPa) | Injection pressure (kPa) | Nozzle diameter (mm) | |
| Au—Sn alloy paste | 1 | 18.2 | balance | 800 | 80 | 3 | 500 | 6000 | 1.5 | 0 |
| | 2 | 19.0 | balance | 800 | 80 | 3 | 500 | 6000 | 1.5 | 0 |
| | 3 | 20.2 | balance | 800 | — | — | 500 | 6000 | 3 | 0 |
| | 4 | 20.5 | balance | 800 | 80 | 3 | 500 | 6000 | 1.5 | 0.5 |
| | 5 | 21.1 | balance | 800 | 80 | 3 | 500 | 6000 | 1.5 | 6 |
| | 6 | 22.0 | balance | 800 | 80 | 3 | 500 | 6000 | 1.5 | 16 |
| | 7 | 23.1 | balance | 800 | 80 | 3 | 500 | 6000 | 1.5 | 22 |
| | 8 | 23.5 | balance | 800 | 80 | 3 | 500 | 6000 | 1.5 | 28 |
| | 9 | 24.0 | balance | 800 | 80 | 3 | 500 | 6000 | 1.5 | 36 |
| | 10 | 26.2 | balance | 800 | 80 | 3 | 500 | 6000 | 1.5 | 40 |
| | 11 | 30.2 | balance | 800 | 80 | 3 | 500 | 6000 | 1.5 | 52 |

From the results shown in FIGS. 1 to 11 and Table 2, the following can be understood. Large voids exceeding 30% of the bump diameter are not generated in Au—Sn alloy bumps 4 to 8 (Inventive bumps according to the present invention) containing Sn: 20.5 to 23.5 mas %. Au—Sn alloy bumps 1 to 2 (Comparative bumps) containing Sn: 18.1 to 18.9 mass %, Au—Sn alloy bump 3 (Conventional bump) containing Sn: 20.1 mass %, and Au—Sn alloy bumps 9 to 11 (Comparative bumps) containing Sn: 24.1 to 30.0 mass % are not preferable since each of them generates large voids exceeding 30% of the bump diameter.

The invention claimed is:

1. An Au—Sn alloy bump made of a solder paste, comprising a composition containing Sn: 20.5 to 23.5 mass % with the balance consisting of Au and unavoidable impurities, wherein
a ratio of an area occupied by Sn-rich primary crystal phase crystallized in a matrix is 0.5 to 30 area % in a cross section of the Au—Sn alloy bump, and
the Au—Sn alloy bump is free of a large void larger than 30 % of a diameter of the Au—Sn alloy bump.

2. The Au—Sn alloy bump according to claim 1, wherein the ratio of the area occupied by Sn-rich primary crystal phase is 10 to 20 area %.

3. A method of producing an Au—Sn alloy bump free of a large void larger than 30% of a diameter of the Au—Sn alloy bump, comprising:
combining and melting Au and Sn raw materials to obtain molten Au—Sn alloy having a composition containing 20.5 to 23.5 mass % and the balance Au and unavoidable impurities;
mechanically mixing the molten Au—Sn alloy;
spraying the mechanically mixed molten Au—Sn alloy from a nozzle to obtain an Au—Sn alloy powder in which a ratio of an area occupied by Sn-rich primary crystal phase crystallized in a matrix os 0.5 to 30 area % in a cross section of a grain of the the Au—Sn alloy powder;
preparing a solder paste by mixing the Au—Sn alloy powder with flux;
coating a part of a substrate by the solder paste in a spot-like manner, and
subjecting the solder paste to a reflow treatment.

4. The method of producing an Au—Sn alloy bump according to claim 3, wherein the molten Au—Sn alloy is mechanically mixed at a temperature from 600 to 1000° C. in the step of mechanically mixing.

5. The method of producing an Au—Sn alloy bump according to claim 3, wherein a diameter of the nozzle used for spraying the mechanically mixed molten Au—Sn alloy in the step of spraying is 1 to 2 mm.

6. The method of producing an Au—Sn alloy bump according to claim 3, wherein the mechanically molten Au—Sn alloy is sprayed by an inert gas at a spraying pressure of 5000 to 8000 kPa with a nozzle gap of not greater than 0.3 mm in the step of spraying.

7. The method of producing an Au—Sn alloy bump according to claim 3, wherein the molten Au—Sn alloy is mixed at a mixing rate of 60 to 100 r.p.m. for 3 to10 minutes in the step of mechanically mixing.

* * * * *